US006875642B2

(12) United States Patent
Voipio

(10) Patent No.: US 6,875,642 B2
(45) Date of Patent: Apr. 5, 2005

(54) METHOD FOR MANUFACTURING THIN FILM, AND THIN FILM

(75) Inventor: Ville Voipio, Vantaa (FI)

(73) Assignee: Janesko Oy, Vantaa (FI)

( * ) Notice: Subject to any disclaimer, the term of this patent is extended or adjusted under 35 U.S.C. 154(b) by 0 days.

(21) Appl. No.: 10/301,740

(22) Filed: Nov. 22, 2002

(65) Prior Publication Data

US 2003/0099778 A1 May 29, 2003

(30) Foreign Application Priority Data

Nov. 23, 2001 (FI) ........................................ 20012304

(51) Int. Cl.[7] .......................... H01L 21/00; H01L 21/84

(52) U.S. Cl. ....................... 438/149; 438/678; 438/758; 438/763; 438/780; 438/782; 427/98.4; 427/169; 427/447; 427/471

(58) Field of Search ................................ 438/149, 678, 438/758, 763, 780–782; 427/98.4, 169, 471, 447, 98

(56) References Cited

U.S. PATENT DOCUMENTS

| | | | | | |
|---|---|---|---|---|---|
| 4,661,428 A | * | 4/1987 | Ishida | ...................... | 430/57.8 |
| 4,775,820 A | * | 10/1988 | Eguchi et al. | .............. | 313/504 |
| 5,405,710 A | | 4/1995 | Dodabalapur et al. | | |
| 5,854,139 A | * | 12/1998 | Aratani et al. | .............. | 438/780 |
| 6,208,423 B1 | | 3/2001 | Voipio et al. | | |
| 6,495,456 B1 | * | 12/2002 | Kanoh et al. | ............... | 438/678 |
| 6,607,981 B1 | * | 8/2003 | Takahashi et al. | .......... | 438/678 |
| 2001/0046107 A1 | * | 11/2001 | Irie et al. | ................. | 360/294.4 |
| 2002/0004180 A1 | * | 1/2002 | Hotta et al. | ................. | 430/311 |

FOREIGN PATENT DOCUMENTS

| | | |
|---|---|---|
| JP | 61-022349 A | 1/1986 |
| JP | 03-142403 A | 6/1991 |
| JP | 05-334721 A | 12/1993 |

OTHER PUBLICATIONS

Finnish Search Report issued in Finnish Application No. 20012304.

C. Jeffrey Brinker et al, "SOL–GEL SCIENCE, The Physics and Chemistry of Sol–Gel Processing," Academic Press, Inc., pp. 2–13, 788, 789 and 794–797 (1990).

* cited by examiner

*Primary Examiner*—Matthew Smith
*Assistant Examiner*—Granvill D. Lee, Jr.
(74) *Attorney, Agent, or Firm*—Burns, Doane, Swecker & Mathis, L.L.P.

(57) ABSTRACT

A method for manufacturing thin film and a thin film. The method comprises dipping a substrate in a solution that dries up forming a layer on the surface of the substrate and controlling layer thickness by changing the rate of dipping the substrate in the solution. Before the next dipping after the first dipping, the position of the substrate is changed such that the next dipping will be carried out in a direction which is at an angle to the direction of the previous dipping.

14 Claims, 1 Drawing Sheet

METHOD FOR MANUFACTURING THIN FILM, AND THIN FILM

Figure 1:
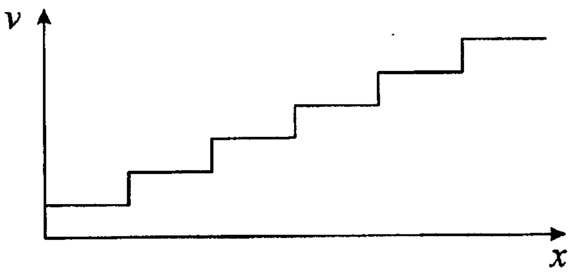

The invention relates to a method for manufacturing a thin film, in which method a substrate is dipped in a solution that dries up forming a layer on the surface of the substrate. The invention also relates to a thin film.

Thin films of the type referred to above are currently known for example in connection with dielectric mirrors, which are used in different applications to reflect light. Examples of such applications include the measurement of different properties of solutions, such as their pH, or the measurement of the concentration of different metal ions in a solution, these properties being measured by utilizing the reflection of light.

Thin films for the above uses may be advantageously made of a solution synthesized in a sol-gel process, which is described in greater detail for example in *Sol-Gel Science, The Physics and Chemistry of Sol-Gel Processing, Academic Press, Inc.* 1990.

In this process, thin films are manufactured by dipping a substrate, such as a glass plate or the like, in a solution of sol-gel, which dries up forming a layer onto the substrate. Layer thickness is a vital factor in measurement optics. The thickness of the film is controlled by means of viscosity and dipping rate. The effect of the dipping rate depends on the structure of the solution: when the structure of the solution is polymeric, a slower dipping rate produces a thinner film. If the solution is of a particulate structure, the layer becomes thinner as the dipping rate increases.

The above method of manufacturing thin films and the use of thin films in various applications is also described in Finnish patent application 981424 (U.S. Pat. No. 6,208,423).

A problem with the prior art is that in practise it is very laborious to find precisely the right dipping rate to produce exactly the right film thickness, for example, for a particular measurement. It should be pointed out that films used for measurement often consist of multiple layers and thus the number of different combinations becomes significantly high. Suitable film thickness can naturally be found by testing, but in practice this method is too laborious and slow.

It is an object of the invention to provide a method for manufacturing thin film and a thin film that allow the prior art shortcomings to be eliminated. This is achieved by a method and thin film of the invention. The method of the invention comprises: changing the position of the substrate after the first dipping and before the next dipping such that the next dipping takes place in a direction which is at an angle to the direction of the previous dipping, and changing the rate of dipping of the substrate in the solution as a function of the substrate position. The thin film of the invention, in turn, comprises: a layer thickness which is arranged to change in a particular direction on each layer, the thickness being arranged to change in each layer in a direction which is at an angle to the direction of change of the thickness in the next layer.

One of the major advantages of the invention is that it allows one and the same film to be provided with a plural number of thicknesses by applying a small number of dippings. Compared with the prior art, this reduces essentially the number of operations to be carried out in the manufacture of films, the related costs decreasing accordingly. Another advantage of the invention is that it is simple and thus economical to implement and use.

Figure 2:
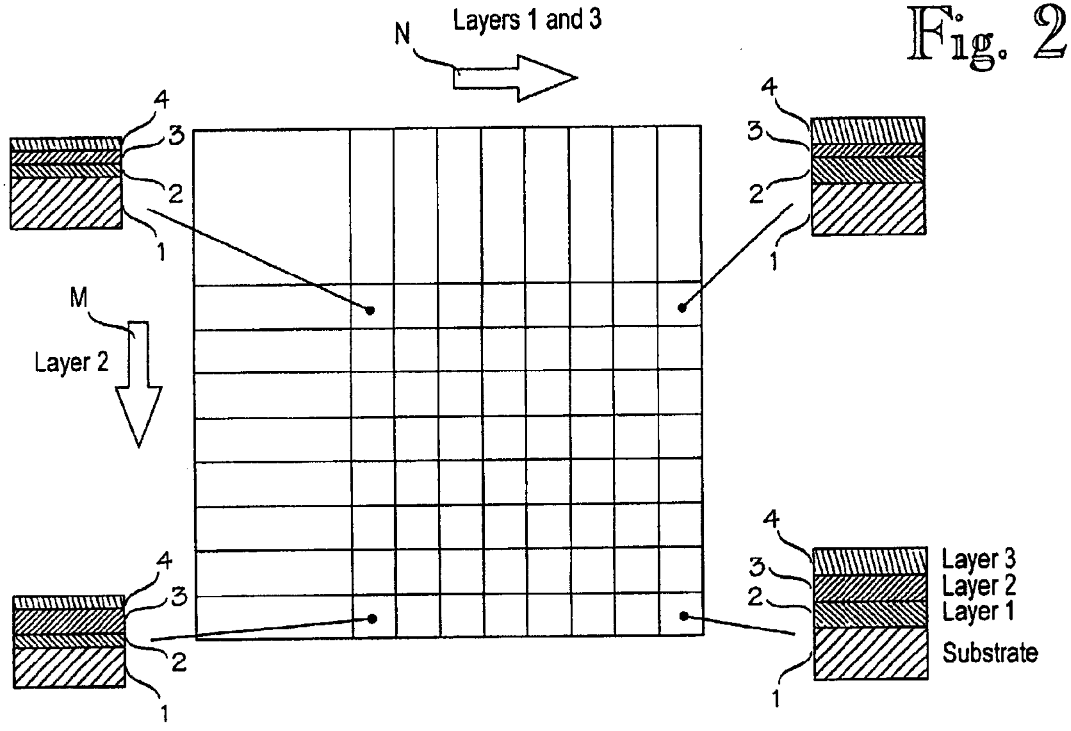
Figure 3:
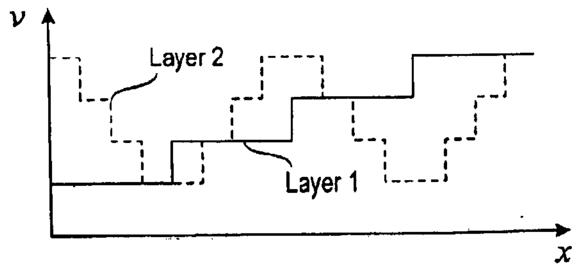

In the following, the invention will be described in greater detail and with reference to the preferred embodiments illustrated in the accompanying drawings, in which FIG. 1 illustrates a dipping rate of a substrate as a function of position according to a method of the invention;

FIG. 2 illustrates variations in layer thickness of a thin film manufactured using the method of the invention; and FIG. 3 illustrates a dipping rate of a substrate as a function of position according to a second embodiment of the method of the invention.

As disclosed above, thin films are manufactured by dipping a substrate in a solution, whereby a layer is formed on the surface of the substrate. Since the dipping is computer-controlled and the arrangement comprises equipment for precise determining of the substrate position, it is possible to vary the dipping rate as a function of distance. By changing the dipping rate stepwise as a function of position, for example, as shown in FIG. 1, it is possible to obtain a stepwise growing thickness profile for a film.

One of the starting points of the invention is that the substrate is dipped, as stated above, in a solution by applying for example a stepwise changing dipping rate, which produces a film having a thickness that increases in the dipping direction. This direction is shown in FIG. 2 by arrow N. In the next phase the substrate is turned substantially 90 degrees, for example, after which follows the next dipping, made in direction M. Also in this dipping phase the dipping rate is increased stepwise. Before the next dipping the substrate is turned again substantially 90 degrees and then follows a new dipping. This dipping is thus performed in the same direction as the first dipping, i.e. in direction N. Also in this dipping phase the dipping rate is changed stepwise.

As a result of the above dipping phases, a chequered thin film is obtained in which layer thicknesses vary stepwise and each square has a different layer thickness combination, as shown in FIG. 2. In FIG. 2 the substrate, such as a glass plate, a plate made of a plastic material or a similar plate, is indicated by reference numeral 1, a first layer by reference numeral 2, a second layer by reference numeral 3 and a third layer by reference numeral 4.

The basic idea of the invention is that it allows one and the same substrate to be provided with different thickness combinations, which eliminates the need to manufacture a great number of films of different thicknesses. A film thickness appropriate for a specific purpose may be selected from the film of the invention for later use in a real measurement operation, for example. The thickness may be selected, for example, visually or by using suitable calculation methods to determine the thickness.

A film manufactured as described above can be used in connection with the solution disclosed in the Finnish Patent Application 981424 (U.S. Pat. No. 6,208,423), for example.

The invention may be varied in many ways. FIG. 3 illustrates a second example of varying the substrate dipping rate as a function of position in different dippings. FIG. 3 shows the variations in the rate of two dippings.

On the basis of FIG. 1 it can be seen that increasing the number of the steps eventually leads to a situation where the number of steps has grown to infinity, i.e. the dipping rate changes steplessly, whereby also the thicknesses of the different layers change steplessly as a function of the substrate position.

The above described examples of the embodiments of the invention are not meant to restrict the invention in any way, but the invention may be freely modified within the claims. Consequently, it is obvious that the thin film of the invention, or its details, do not necessarily need to be implemented exactly as illustrated in the Figures, but other solutions are also possible. For example, the invention is not in any way limited to an angle of substantially 90 degrees between the dipping directions, although in FIG. 2 the dipping directions are set at an angle of 90 degrees. According to the basic idea of the invention, the angle between the dipping directions may vary, the essential aspect being that the dipping directions are at an angle to each other. The invention is not limited to the first and third dipping taking place in the same direction either, but each dipping may also be performed in a different direction. Further, according to the basic idea of the invention the dipping rates can also be changed in many ways by applying for example the principle illustrated in FIG. 3, etc. Further, it is to be noted that according to the idea of the invention, the number of the films is in no way limited to three, although FIG. 2 shows an embodiment with three layers. The invention can also be applied in connection with a plural number of layers, such as four, five, etc., i.e. with multiplayer structures.

What is claimed is:

1. A method for manufacturing a thin film, in which method a substrate is dipped in a solution that dries up forming a layer on the surface of the substrate, the method comprising: changing the position of the substrate after a first dipping and before a next dipping such that the next dipping takes place in a direction which is at an angle to the direction of the first dipping, and changing the rate of dipping of the substrate in the solution as a function of the substrate position.

2. A method according to claim 1, wherein the substrate is turned substantially 90 degrees between successive dippings.

3. A method according to claim 2, wherein the dipping rate is changed stepwise as a function of the position of the substrate.

4. A method according to claim 2, wherein the dipping rate is changed steplessly as a function of the position of the substrate.

5. A method according to claim 1, wherein the dipping rate is changed stepwise as a function of the position of the substrate.

6. A method according to claim 1, wherein the dipping rate is changed steplessly as a function of the position of the substrate.

7. The method for manufacturing a thin film according to claim 1, wherein the rate of dipping of the substrate in the solution is changed as a function of the substrate position during the first or next dipping to obtain a layer having a thickness that changes in the dipping direction.

8. A thin film comprising a substrate with at least two layers formed above its surface, wherein a layer thickness of each layer is arranged to change in a predetermined direction, the thickness being arranged to change in a direction which is at an angle to the direction of change in the thickness of the next layer.

9. A thin film according to claim 8, wherein the directions of change in the thicknesses of adjacent layers are at an angle of substantially 90 degrees to each other.

10. A thin film according to claim 9, wherein the thickness of each layer is arranged to change stepwise in a predetermined direction.

11. A thin film according to claim 9, wherein the thickness of each layer is arranged to change steplessly in a predetermined direction.

12. A thin film according to claim 8, wherein the thickness of each layer is arranged to change stepwise in a predetermined direction.

13. A thin film according to claim 8, wherein the thickness of each layer is arranged to change steplessly in a predetermined direction.

14. A method for manufacturing a thin film, comprising:

dipping a substrate in a solution to form a layer on the surface of the substrate; and during the dipping step, changing the rate of dipping of the substrate in the solution as a function of the substrate position to obtain a layer having a thickness that changes in the dipping direction.

* * * * *